United States Patent [19]

Watanabe et al.

[11] Patent Number: 5,302,548
[45] Date of Patent: Apr. 12, 1994

[54] SEMICONDUCTOR DEVICE MANUFACTURING METHOD

[75] Inventors: Tohru Watanabe; Katsuya Okumura, both of Yokohama, Japan

[73] Assignee: Kabushiki Kaisha Toshiba, Kawasaki, Japan

[21] Appl. No.: 819,051

[22] Filed: Jan. 10, 1992

Related U.S. Application Data

[62] Division of Ser. No. 226,472, Aug. 1, 1988, Pat. No. 5,101,259.

[30] Foreign Application Priority Data

Jul. 31, 1987 [JP] Japan .................................. 62-192068

[51] Int. Cl.⁵ .................. H01L 21/441; H01L 21/324
[52] U.S. Cl. ..................................... 437/187; 437/225; 437/247
[58] Field of Search ...................... 437/187, 225, 247

[56] References Cited

U.S. PATENT DOCUMENTS 4,505,029  3/1985  Owyang et al. .
4,507,333  3/1985  Baise et al. .
4,520,041  5/1985  Aoyama et al. .
4,528,346  7/1985  Sugie et al. .
4,613,888  9/1986  Mase et al. .

Primary Examiner—John S. Maples
Attorney, Agent, or Firm—Foley & Lardner

[57] ABSTRACT

A semiconductor device includes at least one wiring layer containing aluminum as the major constituent and provided through an insulating film on a semiconductor substrate on which components or elements are formed, and a heat resistant high molecular organic film having a radical of small water absorbing property provided on side surfaces of the wiring layer. The heat resisting high molecular organic film is preferably formed of polyphenylene sulfide. A method of the semiconductor device includes the steps of forming components on a semiconductor substrate, forming an insulating film on the components to form an aluminum wiring layer by deposition and patterning, depositing a heat resistant high molecular organic film having a radical of small water absorbing property, and heating the heat resistant high molecular organic film at a temperature to fluidify to and flatten the heat resistant high molecular organic film. An inorganic layer is deposited as a protective layer.

8 Claims, 3 Drawing Sheets

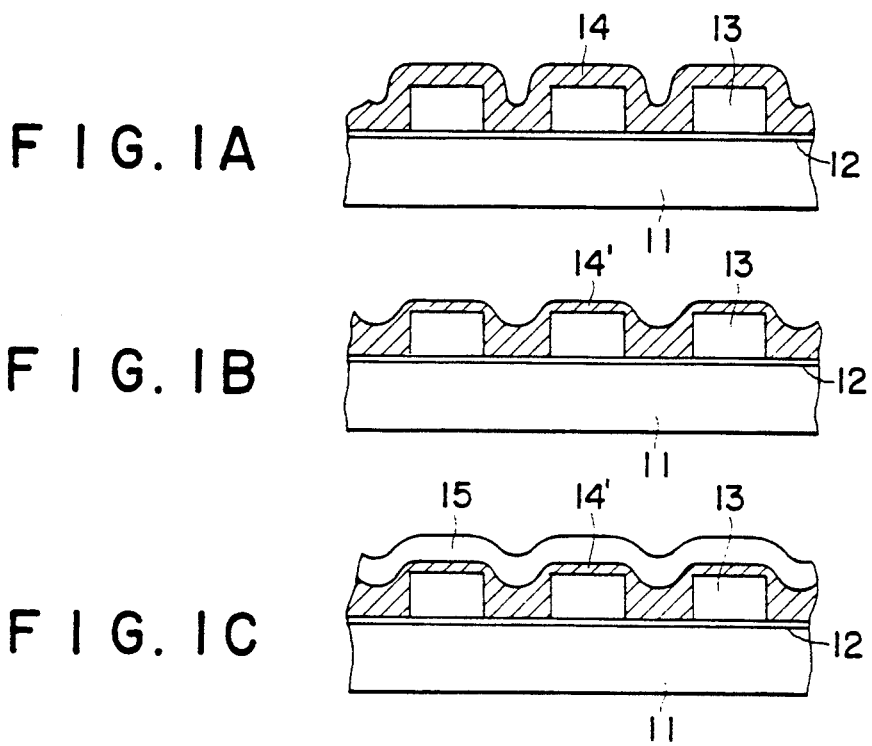
F I G. 1A
F I G. 1B
F I G. 1C
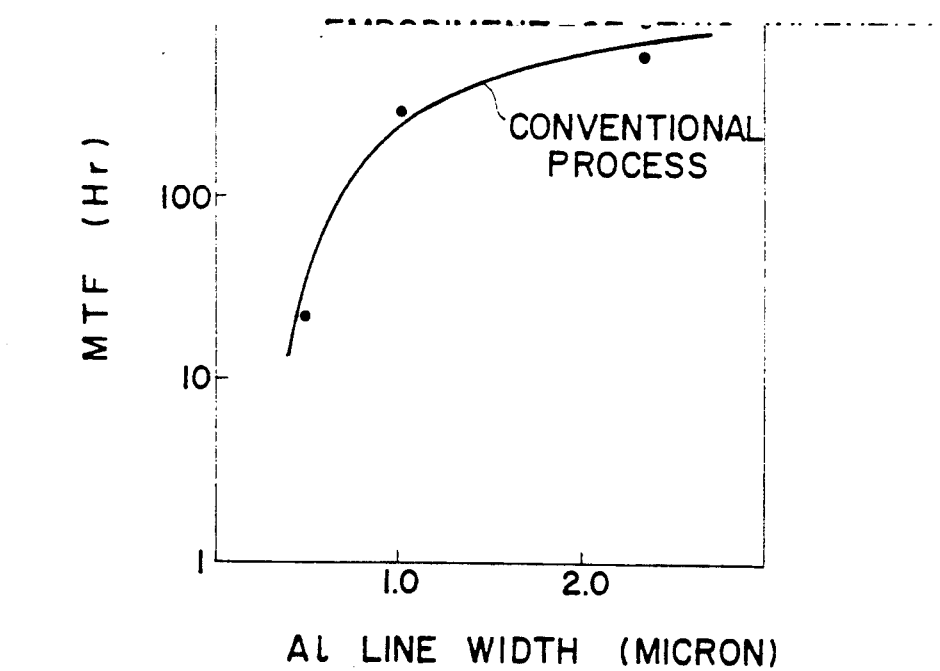
F I G. 2

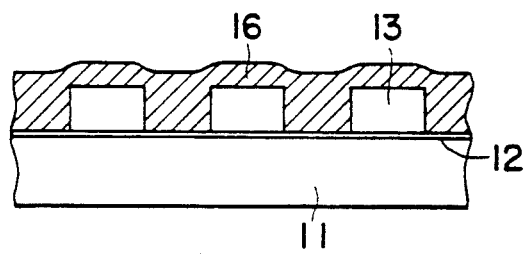
F I G. 3A
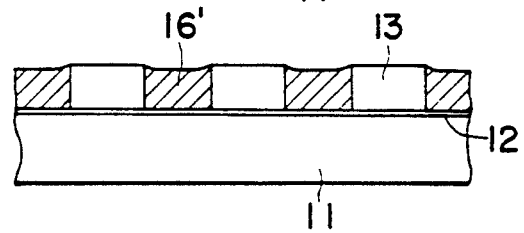
F I G. 3B
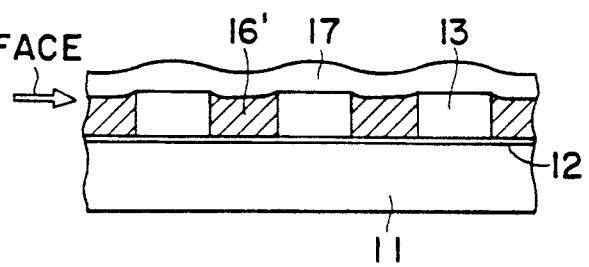
F I G. 3C
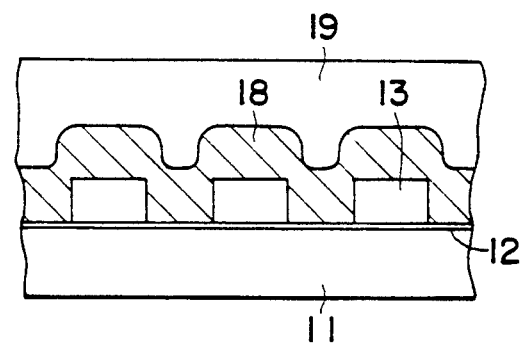
F I G. 4A
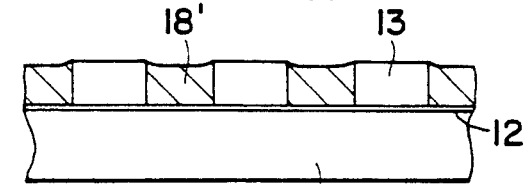
F I G. 4B
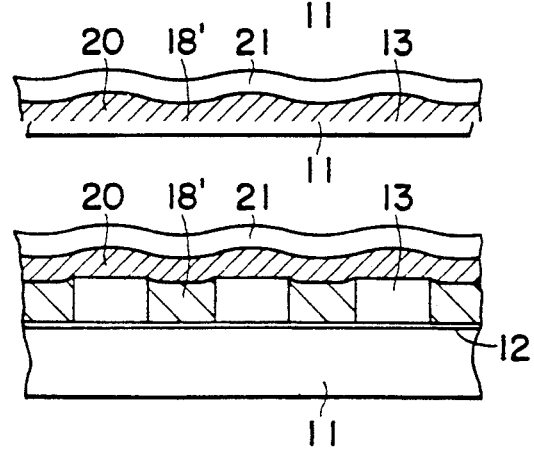
F I G. 4C

SEMICONDUCTOR DEVICE MANUFACTURING METHOD

This application is a division of application Ser. No. 07/226,472, filed Aug. 1, 1988, now U.S. Pat. No. 5,101,259.

BACKGROUND OF THE INVENTION

This invention relates to a semiconductor device and a manufacturing method thereof, and is used particularly in a semiconductor device having high density wiring.

For forming wirings between internal portions of semiconductor elements or components and external portions and/or between or components elements and external portions in a semiconductor device, various materials are used. Especially, for metal wiring, an aluminum alloy, for example, of aluminum and silicon, an alloy of aluminum, silicon and copper, etc. are used.

Typically, an underlying structure of an electrode of polycrystalline silicon, etc. is formed on a semiconductor substrate and a wiring film made of an aluminum alloy is formed thereon. This wiring film is formed by depositing the aluminum alloy over the entire surface of the underlying structure using any one of such methods as sputtering, vacuum deposition and CVD, etc. to carry out patterning of a resist using photolithographic technique, and thereafter effecting etching with the resist as a mask.

For preventing the aluminum alloy film from being exposed and corroded by moisture in the air, a protective inorganic insulating film is formed thereon. As this inorganic insulating film, phosphosilicate glass (PSG) is generally used.

Furthermore, multilevel wiring layer has often been formed in compliance with recent high density requirements. In such a multilayer structure, a first wiring film is formed on the underlying structure and a second wiring film is formed thereon. In addition, an interlayer insulating film is deposited between these wiring films in order to ensure electrical insulating properties therebetween. As this interlayer insulating film, silicon oxide film ($SiO_2$) or silicon nitride film ($Si_3N_4$) which has moisture-proof property and an excellent insulating property is ordinarily used. Such an insulating film may include an impurity such as phosphorus, and is used as a single film, or a composite film.

The wiring width or the line width tends to decrease each year in accordance with recent tendencies for high integration and high density and has been reduced to the order of microns or submicrons in recent years. As a result, such problems as breakage of aluminum wiring of a product occur during test or use of a semiconductor device.

Such a breakage of aluminum wiring, is caused by thermal migration produced by thermal diffusion, electro migration produced by the movement of aluminum atoms as a result of a current flow, corrosion, and the like.

Where an interlayer insulating film is formed, using the chemical vapor deposition (CVD) method, as described above, it is required to raise temperature to 300° to 450° C. In such an elevated temperature condition, the deposited film is in an equilibrium state wherein the stress is small. However, when the temperature is lowered to room temperature, great stress will accumulate in the aluminum film, due to the difference between the coefficient of thermal expansion of aluminum and that of the deposited film. Namely, the stress created in the aluminum film containing 1% silicon immediately after the wiring is formed by etching of the film is $10 \times 10^8$ dyn/cm$^2$, whereas the stress created in the aluminum film after $Si_3N_4$ film has been deposited by plasma CVD at a temperature of 300° C. is changed to $30 \times 10^8$ dyn/cm$^2$. Thus it can be understood that the stress is considerably increased. Such a stress measurement is carried out by measuring the spacing between lattice planes by X-ray diffraction to compare the spacing measured with a lattice plane spacing when a known stress is created.

It has been known that when such a stress is created, the possibility of breaking the aluminum layer is so greatly accelerated so that breakage is likely to occur.

Such a problem also occurs in an interlayer insulating film of multilayer wiring. Particularly, breakage of the aluminum wiring, which is the first layer, presents the same problem. As a solution of this problem, a method has been proposed wherein a polyimide layer is formed between inorganic insulating films for the purpose of alleviating the stress of an aluminum wiring (e.g., Japanese Laid-Open patent specification No. 85724/1977). However, to form a polyimide layer, since it is required to dissolve the polyimide in a solvent to coat the solution and dry it, long-time heat treatments for drying and/or heat treatment for the subsequent polymerization are required. For this reason, the reduction of volume is large and it is difficult to form a flat polyimide layer on an irregular surface.

A further problem is that a polyimide layer has large water absorbing capability, resulting in a tendency to give rise to corrosion of the aluminum, and that polarization is produced as a result of application of a voltage for a long time and, thus, the threshold value of the transistor changes due to polarization, so that an erroneous operation is likely to occur.

SUMMARY OF THE INVENTION

Therefore, an object of this invention is to provide a semiconductor device and a manufacturing method thereof capable of the alleviating stress created in an aluminum wiring layer, thereby preventing breakage thereof.

Another object of this invention is to provide a novel method of manufacturing a semiconductor device, at a high yield and which can operate stably.

According to one aspect of this invention there is provided a semiconductor device comprising:

a one wiring layer containing aluminum as major constituent part and provided on an insulating film on a semiconductor substrate on which semiconductor elements are formed; and a heat resistant high molecular weight organic film having a radical of small water absorbing property of less than 10 PPM the organic film being provided on a side surface of the wiring layer.

According to another aspect of this invention is provided a method of manufacturing a semiconductor device comprising the steps of:

forming semiconductor elements on a semiconductor substrate;

forming an insulating film on the semiconductor elements;

forming an aluminum wiring layer on the insulating film by deposition and patterning thereon;

depositing a heat resistant high molecular weight organic film containing a radical having a small water absorbing property on an entire surface of the semiconductor device; and heating said heat resistant high molecular weight organic film at a temperature to fluidify and flatten said heat resisting high molecular weight organic film.

In a modified method of this invent on a semiconductor device is manufactured by a method of manufacturing a semiconductor device comprising the steps of:

forming components of said semiconductor device on said element on a semiconductor substrate;

forming an insulating film to form an aluminum wiring layer by deposition and patterning;

depositing an inorganic insulating film on said aluminum wiring layer, said inorganic insulating film having a thickness larger than that of said aluminum wiring layer;

back etching said inorganic insulating film to expose surface of said aluminum wiring layer; and depositing a heat resistant high molecular weight organic film having a radical of small water absorbing property on the entire surface.

BRIEF DESCRIPTION OF THE DRAWINGS

In the accompanying drawings:

FIGS. 1A to 1C are cross sectional views of successive process steps showing an embodiment of a method of manufacturing a semiconductor device according to this invention, respectively;

FIG. 2 is a graph showing the breaking characteristic of an aluminum wiring film manufactured by the method shown in FIG. 1;

FIGS. 3A to 3C are cross sectional views of successive process steps showing another embodiment according to this invention;

FIGS. 4A to 4C are cross sectional views of successive process steps showing a further embodiment according to this invention;

FIG. 5 is a cross sectional view of components showing an example in which this invention is applied to a multilayer structure;

DESCRIPTION OF THE PREFERRED EMBODIMENTS

Figure 6:
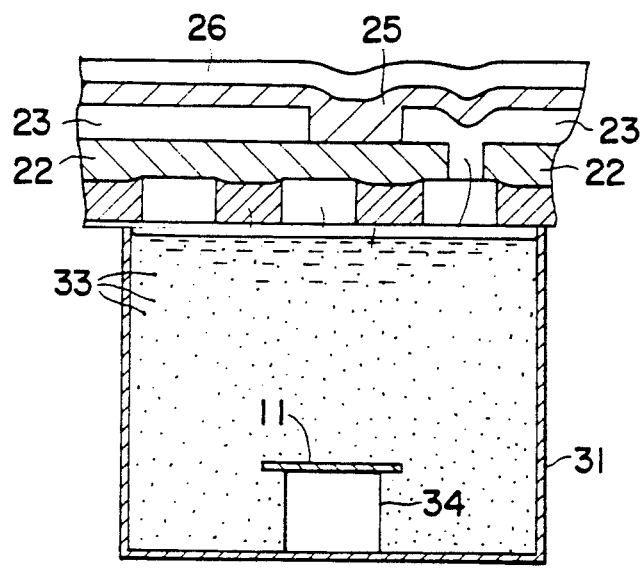
FIG. 6 is vertical sectional view showing an apparatus using sedimentation for deposition.

FIGS. 1A to 1C are cross sectional views of successive process steps showing a method of manufacturing a semiconductor device according to this invention.

On a semiconductor substrate 11, is formed an aluminum wiring layer 13 having a thickness of 0.8 μm and a width of 0.12 μm, for example, through a silicon oxide film 12 formed by thermal oxidation, etc. In the semiconductor substrate 11 are formed impurity diffused regions (not shown) to be utilized as source and drain, electrodes, respectively. After that, an organic film 14 is formed thereon (FIG. 1A). As the material for this organic film, polyphenylene sulfide (PPS) is used and film deposition is carried out by sputtering. Namely, a target consisting of polyphenylene sulfide and a substrate subject to deposition are mounted in an atmosphere of argon with the target held opposite to the substrate. By applying a high frequency power of, e.g., 13.56 MHz to the target, glow discharge is produced to deposit scattered molecules of polyphenylene sulfide on the substrate subject to deposition. Such a condition is shown in FIG. 1A. The deposited organic film has excellent step coverage characteristic over rib shaped aluminum wiring layer 13 and the thickness of the organic film is about 0.4 μm substantially uniformly over the entire surface.

When the aluminum film is sintered at a temperature of about 450° C., since PPS is a thermoplastic material having a glass transition temperature of approximately 280° C., the deposited organic film becomes thin on the upper surfaces of the respective aluminum wiring layers and becomes thick between aluminum wiring layers because the deposited organic film has fluidity in a high temperature, resulting in an organic film 14' having less uneven thickness (FIG. 1B). In this instance, since PPS has a high heat resistant (decomposition temperatures over 450° C.) property,, it is slightly softened by heat during sintering or CVD process for depositing such as inorganic protective layer but does not change its nature, such as decomposition. It is to be noted that PPS is a thermoplastic high molecular compound having a chain polymerized structure such as

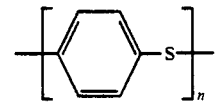

In each unit sulfur is coupled with a phenol ring. This compound has excellent properties in that its heat resistant property is good and the water absorbing property is low (less than 10 PPM), because the molecule has no polarity. It is well known that this water absorbing property (hydroscopicity) can be easily measured by the mass analysis of water content before and after vaporization by heating.

Subsequently, a silicon nitride film 15 is deposited on the organic film 14' by plasma CVD method to a thickness of about 0.5 μm (FIG. 1C).

The stress in the aluminum film $10 \times 10^8$ dyn/cm$^2$ after the aluminum pattern has been formed, $12 \times 10^8$ dyn/cm$^2$ after the organic film has been formed and sintered, and $15 \times 10^8$ dyn/cm$^2$ after silicon nitride film has been formed by CVD method. Thus, it is seen that the stress is greatly less than that in the prior art method.

FIG. 2 is a graph showing the relationship between the aluminum line width and the time elapsed until before breakage, wherein the ordinate shows Mean Time to Failure (MTF) required until one half of the aluminum lines are broken when a current of $2 \times 10^9$ A/cm$^2$ is caused to flow at a temperature of 200° C. in the conventional structure and the structure according to this invention respectively. This graph, shows that in the conventional structure, MFT abruptly lowers as the line width becomes narrower, whereas in the structure of the invention, the MFT is not affected even if the line width becomes narrower and so a high MTF is maintained. It is considered that this is because that the stress is relieved by the organic film layer.

FIGS. 3A to 3C are cross sectional views of successive process steps showing a second embodiment according to this invention. In this embodiment, organic film (PPS) 16 is deposited to be thicker than that of the above-mentioned embodiment shown in FIG. 1, i.e., it has a thickness of 0.8 μm. The organic film 16 is further flattened by heat treatment (FIG. 3A).

Then, etching using oxygen plasma is carried out to remove the upper surface of the organic film 16, thus allowing the upper surfaces aluminum film 13 and the organic film 16' to be at substantially the same level (FIG. 3B). Thereafter, a silicon nitride film 17 is deposited thereon to a thickness of 0.5 μm (FIG. 3C). In this case, the stress created between the silicon nitride film and the aluminum film is only shearing stress along the surface A in FIG. 3C. Thus, the entire stress will be greatly reduced when compared to the case where stress is applied to the side surfaces of the aluminum film.

FIGS. 4A to 4C are cross sectional views of successive process steps showing a third embodiment according to this invention. In this embodiment, a silicon oxide film 18 is deposited by the CVD method to a thickness thicker than that in the second embodiment, i.e., it has a thickness of, about 0.9 μm. Then an ordinary resist 19 is coated so that the thickest portion thereof has a thickness of about 2.0 μm. Then it is flattened (FIG. 4A).

Then, by using a plasma etching method under a condition wherein the etching speeds of the resist and the silicon oxide film 18' are substantially equal to each other, etch back is carried out until the surface of the aluminum film 13 is exposed (FIG. 4B).

Thereafter, a PPS film 20 (0.4 μm thick) and a silicon nitride film 21 are deposited by the sputtering and the CVD method, respectively. At this time, since the silicon nitride film 21 is formed on a flattened surface in the same manner as in the case shown in FIG. 3C, stress is limited to only shearing stress acting along the flattened surface. Thus, total stress is reduced to an extremely small value, with the result that the possibility of breaking is decreased (FIG. 4C).

FIG. 5 is a cross sectional view of a device showing an example where this invention is applied to a multilayer wiring. Etch back is carried out so that the PPS film is present on both the sides of aluminum film 13 in the same manner as in FIG. 3B to form a silicon oxide film 22 on the entire surface. Contact holes 24 for connecting a first aluminum layer 13 with a second aluminum layer 23 are opened at predetermined positions of the silicon oxide film 22. Then, a second aluminum layer 23 is formed by vacuum deposition and etching processes, and a PPS film 25 and a silicon nitride film 26 are formed. The PPS film 25 and nitride film 26 are formed in the same manner as shown in FIGS. 1A to FIG. 1C. In such a construction, the stress applied to the aluminum wiring layer of the first layer will be relieved by the organic film 16, and the stress applied to the aluminum wiring layer 23 of the second layer will be relieved by the PPS film 25 and the silicon oxide film 26.

Figure 7:
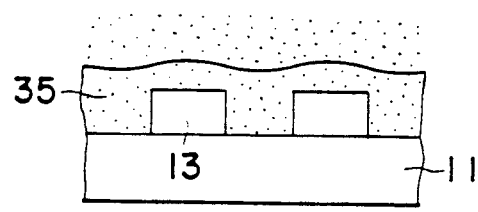
FIG. 7 is a plan view of a portion of the apparatus shown in FIG. 6.

FIGS. 6 and 7 are views showing an example of the sedimentation method as the deposition method instead of sputtering in forming PPS film.

As shown in these figures, a liquid 32 such as water which is chemically inert to PPS is filled within a vessel 31. On a supporting body 34 provided at the bottom surface of the vessel 31, is mounted a semiconductor substrate 11 having aluminum wiring 13 with its upper surface to be deposited positioned upwardly. Fine grains 33 of PPS are mixed into the liquid 32. As such fine grains 33, a powder of PPS having a mean diameter of 0.1 μm is used.

A method of depositing PPS using the device will be now described. Fine grains 33 of PPS are heavier than water because its specific gravity is 1.6. Accordingly, when the mixture of such fine grains 33 and water is stirred and then left to stand still, the grains gradually sink and deposit on semiconductor substrate 11 as shown in FIG. 7, resulting in a deposited film 35. This deposited film 35 cannot be used as is because it has many voids and therefore its density is low. However, by carrying out heat treatment for twenty minutes in an atmosphere of nitride gas at a temperature of 500° C., a film having a density similar to a bulk film can be provided.

While PPS is used as the organic material in the above-mentioned embodiments, other materials having a low glass transition temperature and soft, high decomposition temperature, excellent heat resistant property, no molecular polarity, and low hygroscopicity (less than 10 PPM) may be used. Such materials may be used for the heat resistant high molecular weight material, e.g., polyether sulfon

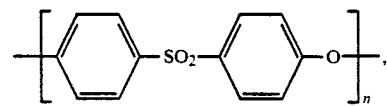

polyether-ether

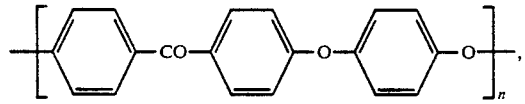

having no polarity and having radicals of small water absorbing property as S, CO, etc.

In addition, as a method of forming an organic film, various methods, e.g., the electrostatic coating method wherein electric charge is applied to a powder of organic material for attracting the particles onto a semiconductor substrate by application of an electric field to thereby deposit them, and the like may be used.

What is claimed is:

1. A method of manufacturing a semiconductor device comprising the steps of:
    forming semiconductor elements on a semiconductor substrate;
    forming an insulating film on said semiconductor substrate;
    forming a wiring layer including aluminum as a major constituent part on said insulating film by deposition and patterning thereon;
    depositing a thermoplastic heat resistant, high molecular weight organic film containing a radical with a small water absorbing property of less than 10 PPM on at lest a side surface of said wiring layer;
    heating said heat resistant high molecular weight organic film at a temperature to fluidize and flatten said heat resistant high molecular weight organic film; and
    depositing a protective layer of inorganic material acting as an uppermost layer of said semiconductor device, said organic film having a lower glass transition temperature than the depositing temperature range of the protective layer and a higher decomposition temperature than maximum process temperature.

2. A method of manufacturing a semiconductor device as set forth in claim 1, wherein said heat resisting high molecular weight organic film has a thickness less than that of said aluminum wiring layer.

3. A method of manufacturing a semiconductor device as set forth in claim 1, wherein said heat resistant high weight molecular organic film is subjected to an etch back process, to expose an upper surface of said aluminum wiring layer.

4. A method of manufacturing a semiconductor device as set forth in claim 1, wherein another aluminum wiring layer is formed on said heat resisting high molecular organic film.

5. A method of manufacturing a semiconductor device as set forth in claim 1, wherein said heat resisting high molecular weight organic film is deposited by sputtering.

6. A method of manufacturing a semiconductor device as set forth in claim 1, wherein said heat resisting high molecular weight organic film is deposited by a sedimentation method.

7. A method of manufacturing a semiconductor device comprising the steps of:

forming semiconductor elements on a semiconductor substrate;

forming an insulating film on said semiconductor substrate;

forming a wiring layer including aluminum as a major constituent part on said insulating film by deposition and patterning thereon;

depositing an inorganic insulating film having a thickness larger than that of said aluminum wiring layer;

etching back said inorganic insulation film to expose a surface of said aluminum wiring layer; and depositing a thermoplastic heat resistant, high molecular weight organic film containing a radical of small water absorbing property of less than 10 PPM on the entire surface, and depositing a protective layer of inorganic material acting as an uppermost layer of said semiconductor device, said organic film having a lower glass transition temperature than the depositing temperature range of the protective layer and a higher decomposition temperature than maximum process temperature.

8. A method of manufacturing a semiconductor device as set forth in claim 7, wherein another aluminum wiring layer is formed on said heat resisting high molecular organic film.

* * * * *